United States Patent [19]

Fukuchi

[11] Patent Number: 5,565,814
[45] Date of Patent: Oct. 15, 1996

[54] FEEDFORWARD AMPLIFIER USING FREQUENCY CHANGEABLE PILOT SIGNAL

[75] Inventor: Akio Fukuchi, Tokyo, Japan

[73] Assignee: NEC Corporation, Japan

[21] Appl. No.: 360,591

[22] Filed: Dec. 21, 1994

[51] Int. Cl.⁶ .................................................. H03F 3/66
[52] U.S. Cl. ................................. 330/52; 330/151
[58] Field of Search ............................ 330/52, 149, 151

[56] References Cited

U.S. PATENT DOCUMENTS

| | | | |
|---|---|---|---|
| 4,885,551 | 12/1989 | Myer | 330/52 |
| 5,166,634 | 11/1992 | Narahashi et al. | 330/151 |

FOREIGN PATENT DOCUMENTS

| | | |
|---|---|---|
| 0367457 | 5/1990 | European Pat. Off. |
| 0466123 | 1/1992 | European Pat. Off. |
| 0557929 | 9/1993 | European Pat. Off. |

OTHER PUBLICATIONS

Japanese Patent Application Laid-Open No. HI-198809 (published Aug. 10, 1989).

Primary Examiner—Steven Mottola
Attorney, Agent, or Firm—Laff, Whitesel, Conte & Saret, Ltd.

[57] ABSTRACT

In a first step, a control circuit 61 turns a switch 63 to detect a frequency of an input signal input to an input terminal 1 and distortion generated by amplification of this input signal or mixed in and sets a frequency of a pilot signal output from a variable frequency oscillator 53 at a value other than the input signal frequency and a frequency of the distortion and close to an average value of the input signal. Thereafter, the control circuit 61 turns the switch 63 off and controls a distortion detecting loop 7 by using the pilot signal in a second step and controls a distortion removing loop 4 in a third step. In a fourth step, it succeeds the control of the distortion removing loop 4 in a normal state and controls the distortion detecting loop 7 again only when environment is changed largely.

4 Claims, 9 Drawing Sheets

FEEDFORWARD AMPLIFIER USING FREQUENCY CHANGEABLE PILOT SIGNAL

BACKGROUND OF THE INVENTION

The present invention relates to a feedforward amplifier and, particularly, to a feedforward amplifier for detecting distortion of an input signal amplified by a feedforward loop and for amplifying the input signal while restricting the distortion.

PRIOR ART

When an input signal including a plurality of frequency-multiplexed carriers is amplified by an amplifier, an intermodulation distortion occurs and is mixed in an output signal of the amplifier. A known feedforward amplifier removes a component of such distortion by means of a feedforward loop.

FIG. 8 shows the construction of an example of a conventional feedforward amplifier. In FIG. 8, the feedforward amplifier is constructed such that it amplifies an input signal having a frequency in a high frequency band received at an input terminal 1. The amplifier detects a distortion introduced therein during the amplification, detection being by means of a distortion detecting loop 2. The distortion is removed by a distortion removing loop 4, after the signal is passed through a power combiner circuit 3. The output signal at terminal 6 is amplified with the distortion removed therefrom.

The distortion detecting loop 2 distributes the input signal through a power distributor 11 to a main signal path 16 composed of a first variable attenuator 12, a first variable phase shifter 13 and a main amplifier 14 and a linear signal path 17 including a first delay line 15. The power combiner 3 outputs a composite signal (difference signal) of the signals from the main signal path 16 and the linear signal path 17. Combiner 3 outputs a main amplified signal as it is from the main signal path 16.

The distortion removing loop 4 includes a main amplifier output signal path 22 including a Second delay line 21 and a distortion signal injecting path 23. A second variable attenuator 24, a second variable phase shifter 25 and an auxiliary amplifier 26 are arranged in a cascade circuit forming the distortion signal injecting path 23. The signals passed through the main amplifier output signal path 22 and the distortion signal injecting path 23 are combined by a power combiner 28. The power distributor 11 and the power combiners 3 and 28 have simple constructions including, for example, transformer circuits, hybrid circuits and directional couplers, etc., respectively.

In the operation of this conventional feedforward amplifier, the high frequency band input signal input received at the input terminal 1 is branched into two channels 16, 17 by the power distributor 11. The high frequency band input signal in one of the channels is amplified through the main signal path 16 including the first variable attenuator 12, the first variable phase shifter 13 and the main amplifier 14. The input signal in the other channel is delayed by a first delay line 15 of the linear signal path 17. The output signals of the main signal path 16 and the linear signal path 17 are supplied to the power combiner 3. The first delay line 15 of the linear signal line 17 and the first variable attenuator 12, the first variable phase shifter 13 and the main amplifier 15 of the main signal path 16 are regulated such that the two signals meet at the input terminal of the power combiner 3. The signals which so meet have the same amplitude while the delay places the two signals in opposite phases. Therefore, the output of the power combiner 3 is a difference signal therebetween.

The linear signal path 17 includes only the first delay line 15 and therefore does not produce any distortion. Consequently, any distortion mixed into the input signal is generated or amplified by the first variable attenuator 12, the first variable phase shifter 13 and the main amplifier 14 of the main amplifying signal path 16. The output of main amplifier 14 can be obtained as the difference error, if the operation of the distortion detecting loop 2 is appropriate. This distortion or difference signal and the output of main amplifier 14 are output from a second output terminal of the power combiner 3 and into the distortion signal injecting path 23, which is the amplified input signal containing the distortion, and which is supplied directly from a first output terminal of the power combiner 3 to the main amplifier output signal path 22.

The transfer functions of the two paths 22 and 23 extending from the input terminals of the power combiner 3 on the side of the path 16 to the output terminal of the power combiner 28 are regulated such that they have the same amplitude and delay and have opposite phases. Therefore, in the power combiner 28, the distortion passed through the distortion signal injecting path 23 is added in opposite phase to the amplified signal passed through the main amplifier output signal path 22 and having the same amplitude as and an opposite phase to those of the distortion. Thus, the distortion of the amplified signal is cancelled out of the signal appearing at the output terminal 6 of the power combiner 28.

However, in the conventional feedforward amplifier mentioned above, it is very difficult to maintain a stable balance between the two feedforward loops 2 and 4, in a time measure, since the characteristics of the amplifier are degraded by variations of environmental temperature, etc.

For example, Japanese Patent Application Laid-open No. H1-198809 (published Aug. 10, 1989) discloses a feedforward amplifier which is provided with means for injecting a pilot signal having specific frequency to a distortion detecting loop for the purpose of enabling the feedforward amplifier to operate stably.

FIG. 9 shows the construction of an exemplary feedforward amplifier. In FIG. 9, the components which are the same as the components shown in FIG. 8 have the same reference numerals.

An input signal is supplied through an input terminal 1 to a distortion detecting loop 7 via a first directional coupler 40. After it is amplified and its distortion component is detected by the distortion detecting loop 7, it is supplied to a distortion removing loop 4 through a power combiner 3.

The distortion detecting loop 7 includes a main amplifier signal path 16 including a power distributor 11, a second directional coupler 41, a first variable attenuator 12, a first variable phase shifter 13 and a main amplifier 16 and a linear signal path 17. The distortion removing loop 4 includes a linear signal path 22 and a distortion signal injecting path 23 including a second variable attenuator 24, a second variable phase shifter 25, an auxiliary amplifier 26 and a third directional coupler 27. An output terminal of a power combiner 28 is connected to an output terminal 6 through a fourth directional coupler 5. An oscillator 51 outputs a pilot signal having a specific frequency which is input to the first directional coupler 40 or to the second directional coupler 41 via a change-over switch 52 and to a mixer 33 of a sync detection circuit 32 including the mixer, a low-pass filter 34 and a d.c. amplifier 35.

A high frequency change-over switch 31 functions to select one output of the directional couplers 5 and 27. The mixer 33 of the sync detection circuit 32 performs a frequency conversion of the constant frequency received from an oscillator 51 with the output signal of the high frequency change-over switch 31. A control circuit 53 controls the first variable attenuator 12 and the first variable phase shifter 13 or the second variable attenuator 25 and the second variable phase shifter 26 on the basis of the output of the sync detection circuit 32.

In this feedforward amplifier, when the distortion detecting loop is to be controlled, the change-over switches 52 and 31 are switched to positions opposite to those shown in FIG. 9 so that the pilot signal is input to the first directional coupler 40 via the switch 52. A signal from the auxiliary amplifier 26 is fed to the sync detection circuit 32 through the third directional coupler 27 and the switch 31. Thus, the control circuit 53 controls an attenuation amount of the first variable attenuator 12 and a phase shift of the first variable phase shifter 13 such that a level of the pilot signal becomes minimum in the output signal of the auxiliary amplifier 26. Thus, it is possible to minimize the distortion component due to unbalanced operation of the distortion detecting loop 7.

On the other hand, when the switches 52 and 31 are positioned as shown in FIG. 9, the pilot signal from the oscillator 51 is input to the main amplifier signal path 16 and to a signal branched by the directional coupler 5 which is taken from the output signal of the power combiner 28 and which is input to the sync detection circuit 32 through the switch 31.

Therefore, the control circuit 53 controls the second variable attenuator 24 and the second variable phase shifter 25 such that the level of the pilot signal contained in the output signal of the power combiner 28 becomes minimum. As a result, an automatic regulation of the distortion removing loop 4 becomes possible.

By executing the above mentioned controls of the distortion detecting loop 7 and the distortion removing loop 4, either continuously or intermittently, an optimum operating condition of the feedforward amplifier is realized. The signal input to the input terminal of this feedforward amplifier is modulated for information transmission and may be discontinuous in some case. Therefore, the operation becomes unstable if this input signal is used for the control. However, since this feedforward amplifier performs the control by using the pilot signal whose level and frequency are constant, a stable control is possible.

Nevertheless, the feedforward amplifier using the pilot signal has a problem because, when the frequency of the pilot signal is set within an operating frequency band, the control becomes unstable if there is an input signal having a frequency that is identical to the frequency of the pilot signal.

On the other hand, when the frequency of the pilot signal is set outside of the operating frequency range, the characteristics of the constitutional components of the paths 16 and 17 of the distortion detecting loop 7 or the paths 22 and 23 of the distortion removing loop 4 must be coincident in a wide frequency range including the pilot signal frequency. For example, in order to obtain a compression amount of 30 dB or more in the frequency range, deviations of amplitude and phase must be within ± 0.3 dB and ± 2°, respectively. These values correspond to a deviation between the pilot signal frequency and the operating frequency when the pilot signal is completely cancelled out. Therefore, it is desirable to set the pilot signal frequency as close to the operating frequency as possible.

Further, the characteristics of the constitutional components of the respective loops 7 and 4, such as the main amplifier 14 and the auxiliary amplifier 26, etc., vary with variations of ambient temperature, etc. In order to follow such variations, it is necessary to control the distortion detecting loop 7 and the distortion removing loop 4, as frequently as possible. However, when the control of the distortion detecting loop 7 is performed, the pilot signal may leak externally although the amount of leakage may be small.

Further, when the pilot signal is to be cancelled by, for example, 40 dB, isolation required in the high frequency switches 52 and 31 must be 40 dB or more. Unfortunately, a semiconductor switch capable of realizing an isolation as large as 40 dB is still not practical. Therefore, high frequency mechanical switches must be used as the switches 52 and 31. The life of such mechanical switches is generally shorter than the life of a semiconductor switch.

SUMMARY OF THE INVENTION

An object of the present invention is to provide a feedforward amplifier capable of solving the above mentioned problems by setting a pilot signal frequency at a predetermined value around an average frequency of an input signal and by continuously executing a control of a distortion removing loop to end the operation of a distortion detecting loop and the distortion removing loop.

In order to achieve the above object, a feedforward amplifier includes a distortion detecting loop for amplifying an input signal and for detecting distortion generated by the amplification of the input signal. A power combiner for deriving the distortion contained in the input signal amplified by the distortion detecting loop and a distortion removing loop for cancelling out the distortion of the derived distortion.

According to the invention, a variable frequency oscillator provides a pilot signal having its frequency controlled externally. A receiver receives the distortion derived from a portion of the distortion removing loop. The amplified signal distortion is cancelled out by the distortion removing loop. A first control circuit sets the frequency of the pilot signal from the variable frequency oscillator to a value other than the frequencies of the input signal and the distortion and close to an average value of the frequency of the input signal. A second control circuit controls a transfer function of the distortion detecting loop on the basis of a receiving level of the distortion component when the pilot signal is input to the distortion detecting loop together with the input signal. A third control circuit controls a transfer function of the distortion removing loop on the basis of a received level of an amplified signal whose distortion is cancelled out when the pilot signal is supplied to a signal path of an amplifying element in the distortion detecting loop.

In the present embodiment, the first control circuit sets the frequency of the pilot signal from the variable frequency oscillator to a value other than the frequencies of the input signal and the distortion and sets it close to an average value of the frequency of the input signal. Therefore, the frequency of the input signal to the distortion detecting loop, which is to be amplified thereby, never become identical to the frequency of the pilot signal. The pilot signal frequency can be set as close as possible to the input signal frequency to be amplified.

Further, according to the present invention, the fourth control circuit controls the distortion detecting and removing loops such that the control of the distortion removing loop is performed normally by the third control circuit. The control of the distortion detecting loop is performed by the second control circuit when an environmental condition is changed largely. Therefore, the control time of the distortion detecting loop can be minimized.

DETAILED DESCRIPTION OF THE PREFERRED EMBODIMENTS

Figure 1:
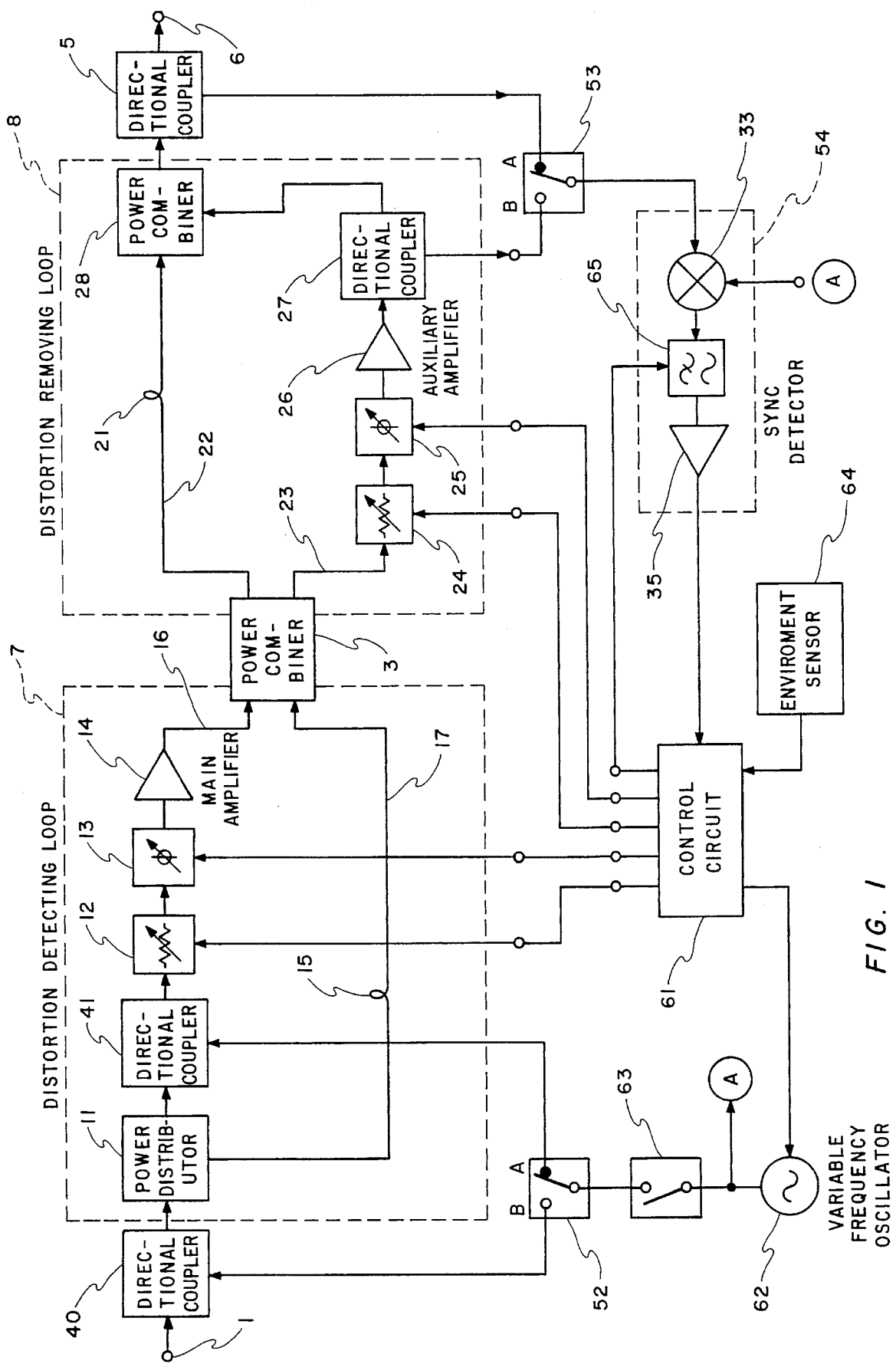
FIG. 1 shows a construction of an embodiment of a feedforward amplifier according to the present invention.
Figure 9:
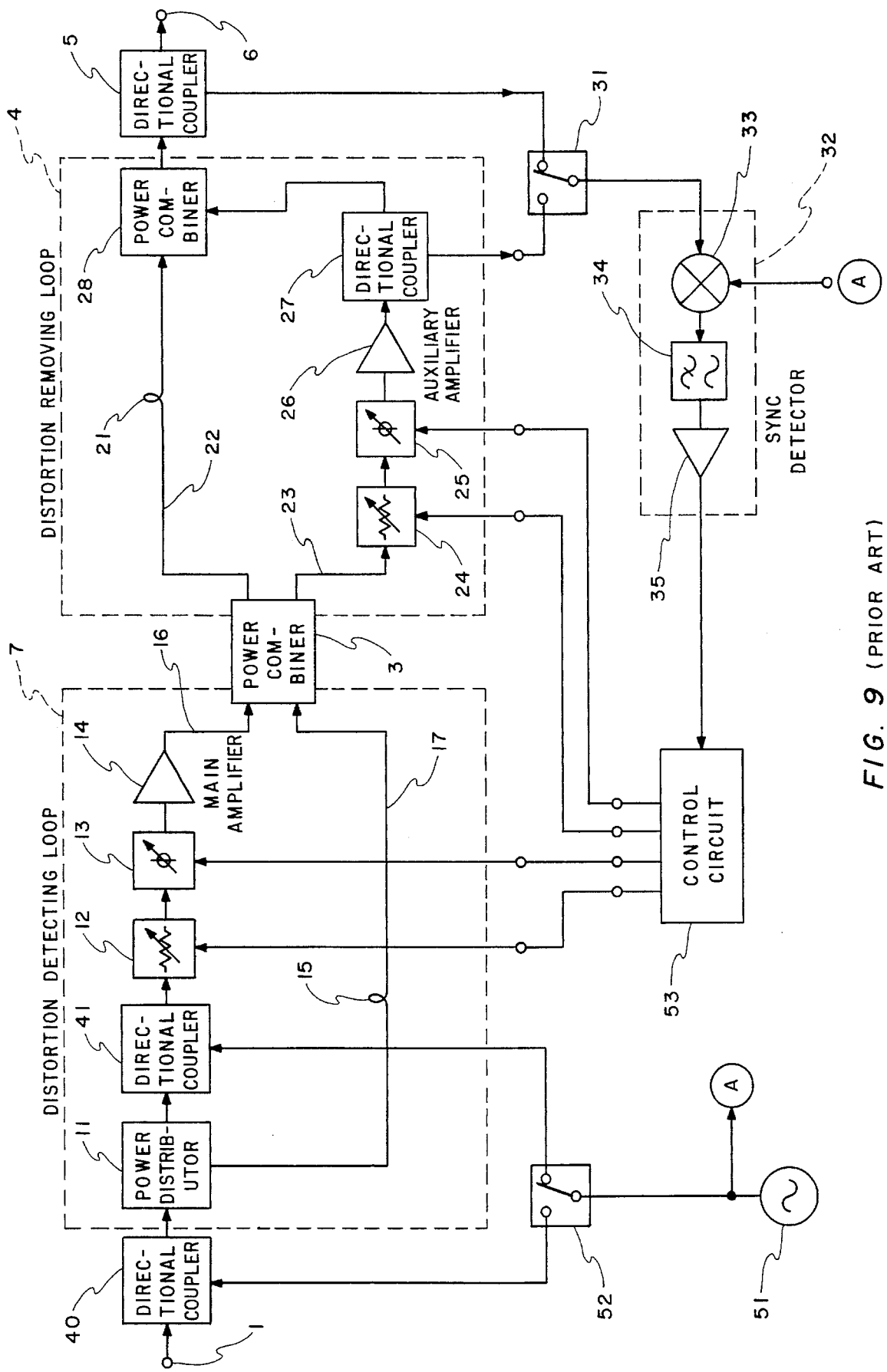
FIG. 9 is a construction of another example of the conventional feedforward amplifier.

FIG. 1 shows an embodiment of a feedforward amplifier according to the present invention. In FIG. 1, the components which are the same as those shown in FIG. 9 are depicted by the same reference numerals, without detailed explanation thereof.

In FIG. 1, a control circuit 61 controls (a) the attenuation of a first variable attenuator 12, (b) the phase shift of a first variable phase shifter 13 of a distortion detecting loop 7, (c) the attenuation of a second variable attenuator 24, (d) the phase shift of a second variable phase shifter 25, (e) a cut-off frequency of a variable low-pass filter 65 of a sync detection circuit 54, and (f) an oscillation frequency of a variable frequency oscillator 62. The variable frequency oscillator 62 is a voltage-controlled oscillator whose output frequency is variably controlled by an output voltage of the control circuit 61 and is used as a pilot signal.

A high frequency switch 63 is an on/off switch controlled by the control circuit 61 which passes the output signal (the pilot signal) of the variable frequency oscillator 62 to a high frequency switch 52 or which cuts out the output signal passage to the latter high frequency switch. An environment sensor 64 detects environmental conditions such as the ambient temperature and outputs an electric signal having a level corresponding to the detected conditions. The high frequency switch 53 selects one of the output signals of the directional couplers 5 and 27 and supplies it to the mixer 33 of the sync detection circuit 54. The high frequency switches 52, 53 are ON/OFF controlled by the switching signal from the control circuit 61 similar to the control of the high frequency switch 63.

Figure 2:
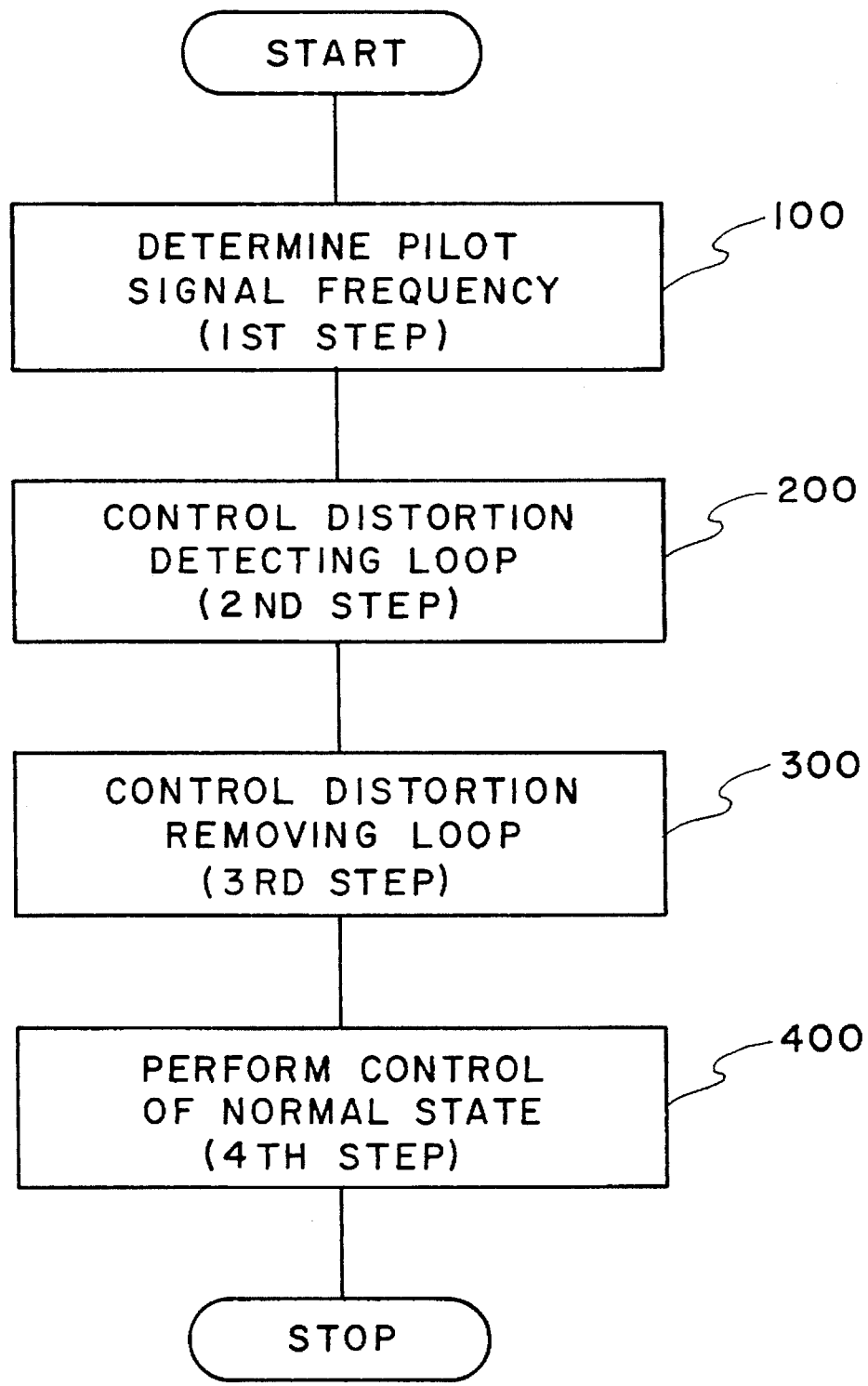
FIG. 2 is a flowchart of an operation of the embodiment shown in FIG. 1.

An operation of this (FIG. 1) embodiment will be described. In the feedforward amplifier of this embodiment, the operation including four steps is performed in the sequence shown in FIG. 2. This operation is under the control of the control circuit 61. That is, in the first step, the frequency of the pilot signal is determined (step 100). Then, in the second step, the distortion detecting loop 7 is controlled (step 200). Then, in the third step, the distortion removing loop 4 is controlled (step 300). Finally, in the fourth step, the normal state control is performed (step 400). The operations in the respective steps will be described in more detail.

(1) First Step (100)

Figure 3:
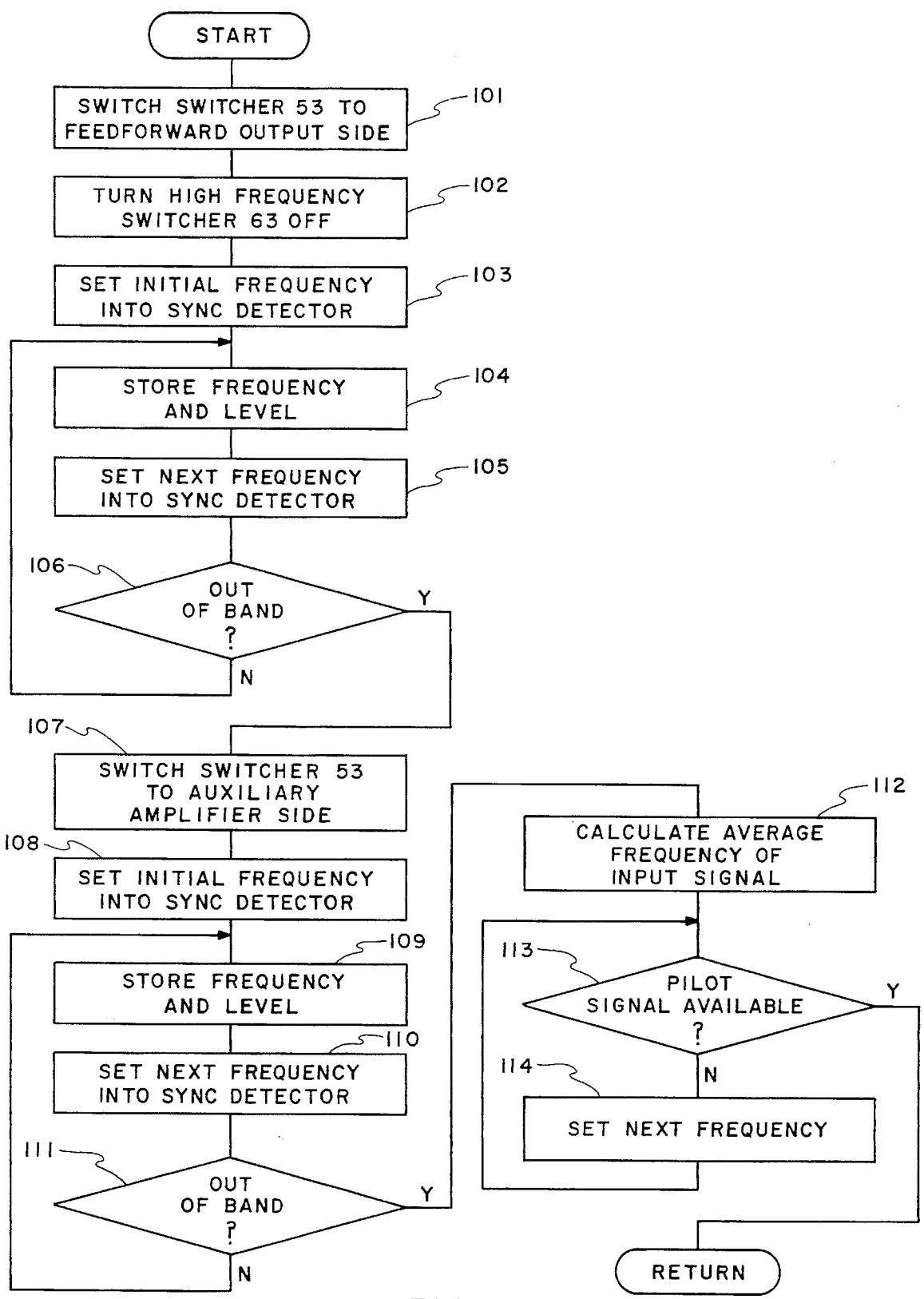
FIG. 3 is a flowchart of a first step of the operation shown in FIG. 2.

The determination of the pilot signal frequency in the first step is performed according to the flowchart shown in FIG. 3. First, the switch 53 shown in FIG. 1 is connected to a terminal A such that the output signal of the feedforward amplifier is input through the fourth directional coupler 5 and the switch 53 to the sync detection circuit 54 (step 101). Then, the high frequency switch 63 is turned OFF (step 102) such that the pilot signal is not input to the distortion detecting loop 7.

Thus, only the input signal received from the input terminal 1 is allowed to pass to the power distributor 11 via the first directional coupler 40. Distributor 11 divides the signal into two signals, one of which is input to the main amplifier 14 via the second directional coupler 41, the first variable attenuator 12 and the first variable phase shifter 13, and the other of which is input to the power combiner 3 after being delayed by the first delay line 15. The input signal is, for example, a signal obtained by time-division multiplexed five carriers having identical amplitude. The feedforward amplifier linearly amplifies these five carriers simultaneously.

As described previously, the power combiner 3 not only outputs the output signal of the main amplifier 14 directly from the first output terminal to the main amplifier signal path 22 of the distortion removing loop 4 but also combines the output of the main amplifier 14 from the second output terminal with the input signal from the delay line 15. Thus, power combiner derives a distortion mixed in or generated by the constitutional components of the path 16 and outputs it to the distortion signal injecting path 23 of the distortion removing loop 4. The distortion removing loop 4 cancels out the distortion input to the distortion signal injecting path 23 in a manner which is similar to that used in the conventional feedforward amplifier and outputs the amplified and distortion-restricted signal from the power combiner 28 through the fourth directional coupler 5 to the output terminal 6 and to the switch 53, as the output signal of the feedforward amplifier.

In this case, the control circuit 61 controls the output oscillation frequency (pilot signal frequency) of the variable frequency oscillator 62 to a certain frequency so that the sync detection circuit 54 performs a sync detection at the frequency (step 103). Then, the control circuit 61 stores the frequency and level of the output signal of the feedforward amplifier which were synchronously detected by the sync detection circuit 54 (step 104). Then, the control circuit 61 changes the output oscillation frequency of the variable frequency oscillator 62 to another value such that the sync detection circuit 54 operates on the new frequency (step 105) and then determines whether or not the new frequency is within the predetermined available frequency range (step 106). If it is within the predetermined available frequency range, the control circuit 61 re-stores the frequency and level of the output signal of the feedforward amplifier which was synchronously detected in the step 104.

In this manner, the control circuit 61 stores the frequency and level of the output signal of the feedforward amplifier while sequentially changing the sync detection frequency of the sync detection circuit 54 within the available frequency range by controlling the output frequency of the variable frequency oscillator 62 (steps 109 to 111).

Thus, the frequency of the intermodulation distortion between the five carriers is generated when the main amplifier 14 amplifies the input signal. In a case where the control circuit 61 is capable of computing a frequency component of distortion generated by the frequency and level of the input signal, there is no need for performing the processing in the steps 109 to 111.

Thereafter, the control circuit 61 calculates an average value of the frequencies (in this embodiment, 5 carrier frequencies) of the input signal stored in the step 104 (step 112) and then the pilot signal frequency is determined in steps 113 and 114. That is, it is impossible to perform a stable high speed control if the pilot signal frequency is coincident with the frequency of the input signal or the distortion frequency generated due to the presence of the input signal and, therefore, a highly precise frequency characteristic of the two loops 7 and 4 is required if the pilot signal frequency differs considerably from the input signal frequency.

In view of this fact, in this embodiment, the pilot signal frequency is set to a value which is neither the input signal frequency stored in the step 104 nor the distortion frequency generated by the input signal stored in the step 109, but is set around the average value of the input signal frequencies calculated in the step 112 (steps 113 and 114).

Alternatively, in a case where the number of carriers of the input signal is not so many and the carrier frequencies of the input signal are predictable, it may be possible to select a suitable frequency without scanning the sync detection frequency in the sync detection circuit 54 and then to confirm it, if it is coincident with neither the input signal frequency nor the distortion frequency, by switching the switch 53 between the terminals A and B.

(2) Second Step (200)

Figure 4:
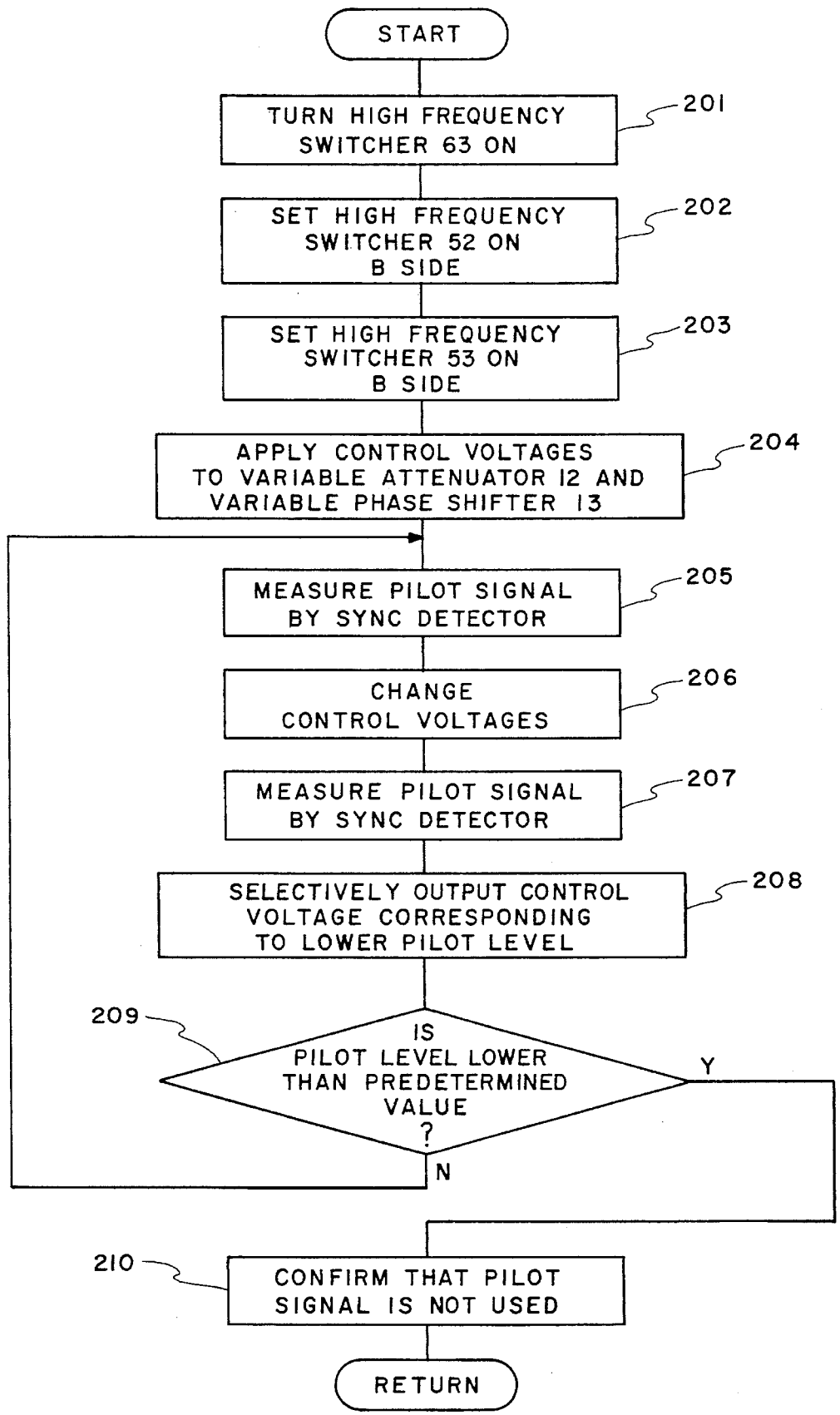
FIG. 4 is a flowchart of a second step of the operation shown in FIG. 2.

The control of the distortion detecting loop 7 is performed according to the flowchart shown in FIG. 4. First, the high frequency switch 63 shown in FIG. 1 is turned ON (step 201). Then, the high frequency switches 52 and 53 are connected to the terminals B (steps 202 and 203). With this procedure, the pilot signal generated by the variable frequency oscillator 62 (having a frequency determined in the First Step) is supplied through the high frequency switch 63, the switch 52 and the first directional coupler 40 to the distortion detecting loop 7. The output distortion component of the auxiliary amplifier 26 is supplied through the third directional coupler 27 and the switch 53 to the sync detection circuit 54. In this case, it is possible for the control circuit 61 to improve the signal to noise ratio (S/N ratio) of the sync detection circuit 54 by controlling the cut-off frequency of the variable low-pass filter 65 contained in the sync detection circuit 54 so that the pass band of the sync detection circuit 54 is narrowed.

Then, the control circuit 61 applies suitable control voltages to the variable attenuator 12 and the variable phase shifter 13 (step 204). After the detection of the level of the sync detection circuit 54, that is, the level of the pilot signal, at that time is measured (step 205), the control voltages are changed to other values (step 206). The detection level of the pilot signal of the sync detection circuit 54 is measured again (step 207).

The pilot signal level sync detected at that time by the sync detection circuit 54 is the distortion level indicative of an error between signals in the paths 16 and 17 of the distortion detecting loop 7 which are equal in amplitude and opposite in phase. Therefore, the control circuit 61 controls the variable attenuator 12 and the variable phase shifter 13 with control voltages with which a low detection level among the detection levels of the measured pilot signal is obtained (step 208).

Then, the control circuit 61 decides whether or not the detection level of the pilot signal at that time is lower than a predetermined value (step 209). If it is higher, the process is returned to the step 205. In this manner, the control circuit 61 controls the amount of attenuation of the variable attenuator 12 and the amount of phase shift of the variable phase shifter 13 such that the level of the pilot signal detected by the sync detection circuit 54 and input to the control circuit 61 becomes a minimum value which is smaller than the predetermined value. The control method in this case is preferably based on an algorithm having a high converging speed, such as the steepest descent method.

Thereafter, the control circuit 61 confirms that the pilot signal frequency is coincident with neither the input signal frequency at the input terminal 1 nor the distortion frequency generated by this input signal and responds by turning OFF the high frequency switch 63 (step 210).

(3) Third Step (300)

Figure 5:
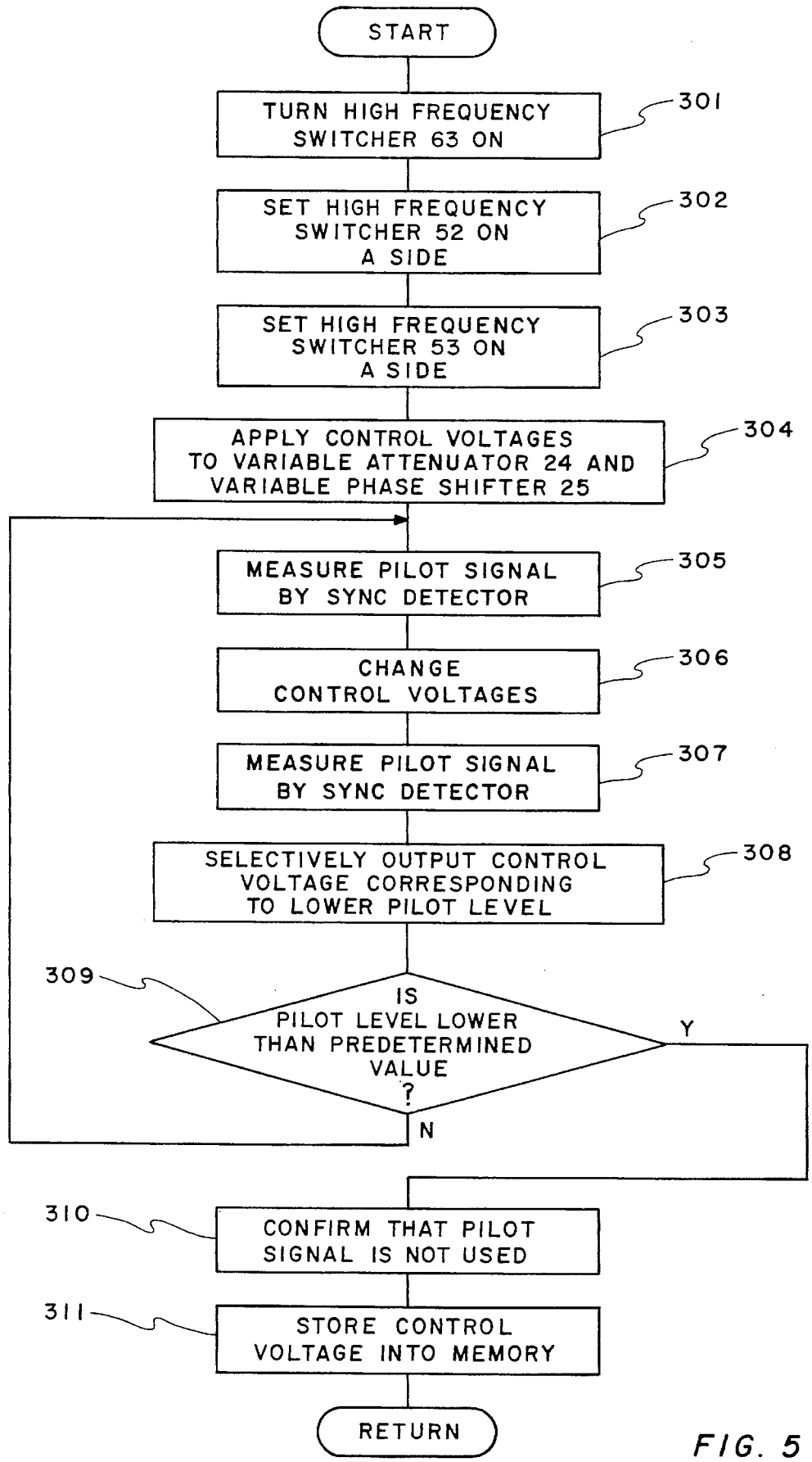
FIG. 5 is a flowchart of a third step of the operation shown in FIG. 2.

The control of the distortion removing loop 4 is performed according to the flowchart shown in FIG. 5. First, the high frequency switch 63 shown in FIG. 1 is turned ON (step 301). Then the high frequency switches 52 and 53 are connected to the terminals A (steps 302 and 303). With this procedure, the pilot signal generated by the variable frequency oscillator 62 (having a frequency determined in the First Step) is supplied through the high frequency switch 63, the switch 52 and the second directional coupler 41 to the path 16 of the distortion detecting loop 7. The output signal of the distortion removing loop 4 is supplied through the fourth directional coupler 5 and the switch 53 to the sync detection circuit 54.

Then, the control circuit 61 applies initial values of the control voltages to the variable attenuator 24 and the variable phase shifter 25 (step 304). After the detection of the level of the sync detection circuit 54, that is, the level of the pilot signal at that time is measured (step 305). The control voltages are changed to other values (step 306). The detection level of the pilot signal of the sync detection circuit 54 is measured again (step 307).

The pilot signal level sync detected by the sync detection circuit 54 at that time is the distortion level which is indicative of an error between signals in the paths 22 and 23 of the distortion removing loop 4, which signals are equal in amplitude and opposite in phase. Therefore, the control circuit 61 controls the variable attenuator 24 and the variable phase shifter 25 with control voltages which are obtained by a low detection level among the detection levels of the measured pilot signal (step 308).

Then, the control circuit 61 decides whether or not the detection level of the pilot signal at that time is lower than paths in the distortion detecting loop is not required to be as precisely coincident with the frequency of the other of the two paths. This is also true for the distortion removing loop, the feedforward amplifier can be easily constructed.

Further, since the control time of the distortion detecting loop can be made short by the Fourth control means, the external leakage of the pilot signal is minimized. Further, since the frequency of switching the control between the distortion detecting loop and the distortion removing loop is lower than the frequency of the conventional feedforward amplifier, it is possible to construct the feedforward amplifier having a longer life as compared with the conventional amplifier, even if mechanical high frequency switches are used.

What is claimed is:

1. A feedforward amplifier including a distortion detecting loop for amplifying an input signal and detecting at least distortion generated by amplification of the input signal, a power combiner for deriving the amplified input signal and the distortion contained in the amplified input signal from said distortion detecting loop and a distortion removing loop for cancelling out the distortion from the amplified input signal from said power combiner, said feedforward amplifier comprising:

a variable frequency oscillator for outputting a pilot signal having frequency controlled by an external signal;

receiving means for receiving a distortion component derived from a portion of said distortion removing loop and the amplified signal whose distortion is cancelled out by said distortion removing loop;

first control means for setting the frequency of the pilot signal from said variable frequency oscillator to a value other than the frequencies of the input signal and the distortion and close to an average value of the frequency of the input signal;

second control means for controlling a transfer function of said distortion detecting loop on the basis of a receiving level of the distortion component when the pilot signal is input to said distortion detecting loop together with the input signal; and third control means for controlling a transfer function of said distortion removing loop on the basis of a receiving level of an amplified signal whose distortion is cancelled out when the pilot signal is supplied to a signal path of an amplifying element in said distortion detecting loop.

2. The feedforward amplifier claimed in claim 1, further comprising an environment sensor for outputting a signal having a level corresponding to a detected environmental state and fourth control means for succeeding the control of said distortion removing loop by said third control means in a normal state after execution of control by said first to third control means and executing the control of said distortion detecting loop by said second control means again when there is a change in the output signal of said environment sensor exceeding a predetermined value.

3. The feedforward amplifier claimed in claim 1, further comprising fourth control means for succeeding the control of said distortion removing loop by said third control means in a normal state after execution of control by said first to third control means and executing the control of said distortion detecting loop by said second control means again when there is a change in a control voltage of said distortion removing loop exceeding a predetermined value.

4. The feedforward amplifier claimed in claim 2 or 3, wherein said fourth control means succeeds the control of said distortion removing loop until a predetermined time lapses after an end of control of said third control means and executes the control of said distortion detecting loop by said second control means again after the predetermined time lapses.

* * * * * a predetermined value (step 309). If it is higher, the process is returned to the step 305. In this manner, the control circuit 61 controls the amount of the attenuation of the variable attenuator 24 and the amount of the phase shift of the variable phase shifter 25 such that the level of the pilot signal detected by the sync detection circuit 54 and input to the control circuit 61 becomes a minimum value which is smaller than the predetermined value.

Thereafter, the control circuit 61 confirms that the pilot signal frequency is coincident with neither the input signal frequency at the input terminal 1 nor the distortion frequency generated by this input signal by turning OFF the high frequency switch 63 (step 310). Then, the control circuit 61 stores the control voltages of the variable attenuator 24 and the variable phase shifter 25 and the output voltage of the environment sensor 64, at this time. This storage is in the built-in memory (step 311).

(4) Fourth Step (400)

Figure 6:
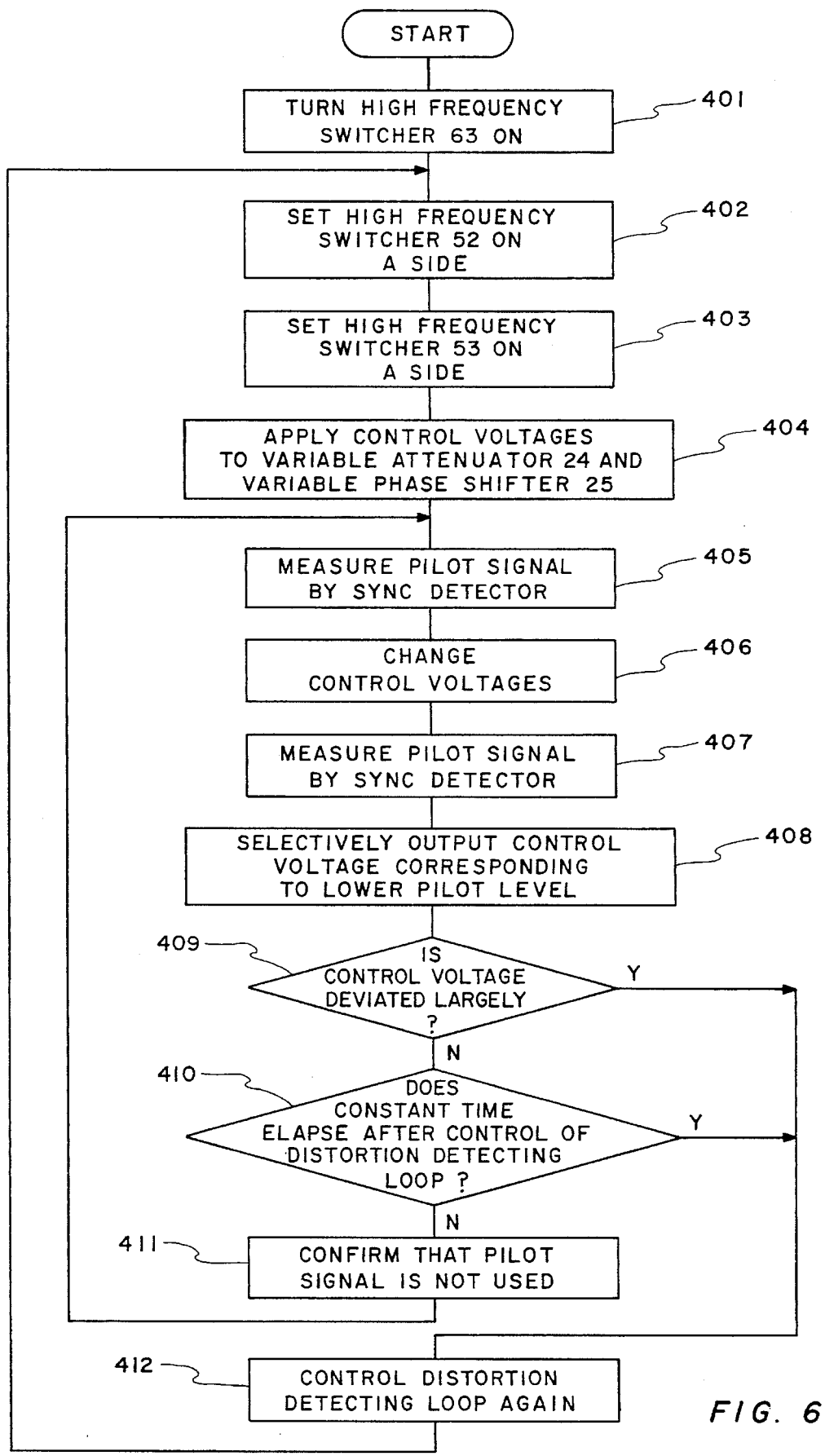
FIG. 6 is a flowchart of a fourth step of the operation shown in FIG. 2.

In the normal state, the control in the Fourth Step is performed according to the flowchart shown in FIG. 6. It should be noted that, at the end of the control in the Third Step, the optimum operation of the feedforward amplifier is realized. However, from time to time, the control must follow the variations of the gain and the phase of the amplifier, due to variation of the environment condition, such as the ambient temperature.

Further, although the attenuation of the distortion removing loop 4 directly determines the attenuation of distortion, the attenuation of the input signal by the distortion detecting loop 7 is to prevent the level of the input signal leaked to the auxiliary amplifier 26 from becoming too high. Therefore, when there is some margin in the output of the auxiliary amplifier 26, the amount of attenuation of the distortion removing loop 4 becomes correspondingly flexible. Further, when the distortion detecting loop 7 is controlled, the pilot signal leaks externally.

According to this embodiment, the control of the distortion removing loop 4 is performed in the normal state, as the Fourth Step control. Usually, there is almost no case where the control voltages are largely changed in the normal state. Therefore, it is preferable to use a control method in which respective control voltages are changed slightly. Therefore, in the Fourth Step, first the control circuit 61 controls the amount of the attenuation of the variable attenuator 24 and the amount of the phase shift of the variable phase shifter 25 with the control voltages for the lower detection level of the pilot signal as detected by the sync detection circuit 54 and input to the control circuit 61 through steps 401 to 408 which is similar to the control steps 301 to 308 of the distortion removing loop 4 in the Third Step. Then, the control circuit 61 determines whether or not the control voltages are largely deviated from the predetermined values (step 409).

If there is no large deviation, the control circuit 61 determines whether or not there is a constant time lapse following the previous control of the distortion detecting loop 7 (step 410). If the constant time period has not lapsed, it is confirmed by turning OFF the high frequency switch 63 whether or not the pilot signal frequency is coincident with neither the input signal frequency nor the distortion frequency caused by the input signal (step 411). Then, by changing the control voltages, the process is returned to the step 405 to obtain the control voltages with which a lower detection level of the pilot signal is obtained.

On the other hand, if it is decided in the step 409 that the control voltages are largely deviated, it is assumed that the large deviation of the control voltages of the distortion removing loop 4 is due to a large environmental change since the distortion detecting loop 7 and the distortion removing loop 4 are thought of as being under substantially the same environmental condition and the distortion removing loop 4 is thought of as always being controlled to the optimum value. Therefore, the control circuit 61 decides this as the necessity of control of the distortion detecting loop 7. After it controls the distortion detecting loop 7 again (step 412), it returns to the step 402 to control the distortion removing loop 4 in the normal state again.

Further, since the components of the feedforward amplifier are subjected to age variation, it is necessary to activate the distortion detecting loop 7 at a relatively long time interval. Therefore, when it is decided in the step 410 that the constant time is lapsed following the previous control of the distortion detecting loop 7, the control circuit 61 also decides that a control of the distortion detecting loop 7 is necessary. After it controls the distortion detecting loop 7 again (step 412), it is returned to the step 402 to control the distortion removing loop 4 in the normal state.

Figure 7:
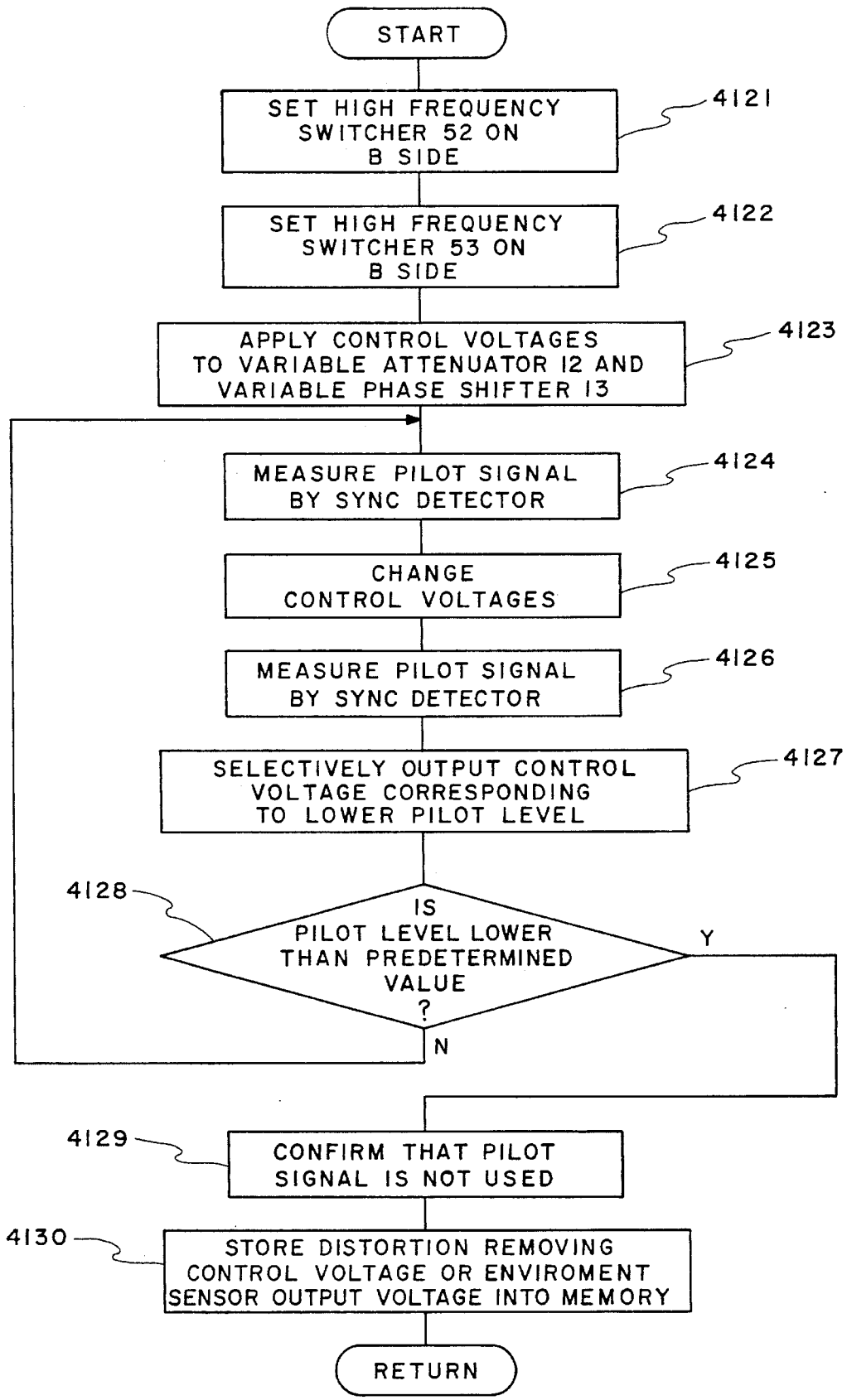
FIG. 7 is a flowchart of a re-control operation of a distortion detecting loop of the embodiment shown in FIG. 1.
Figure 8:
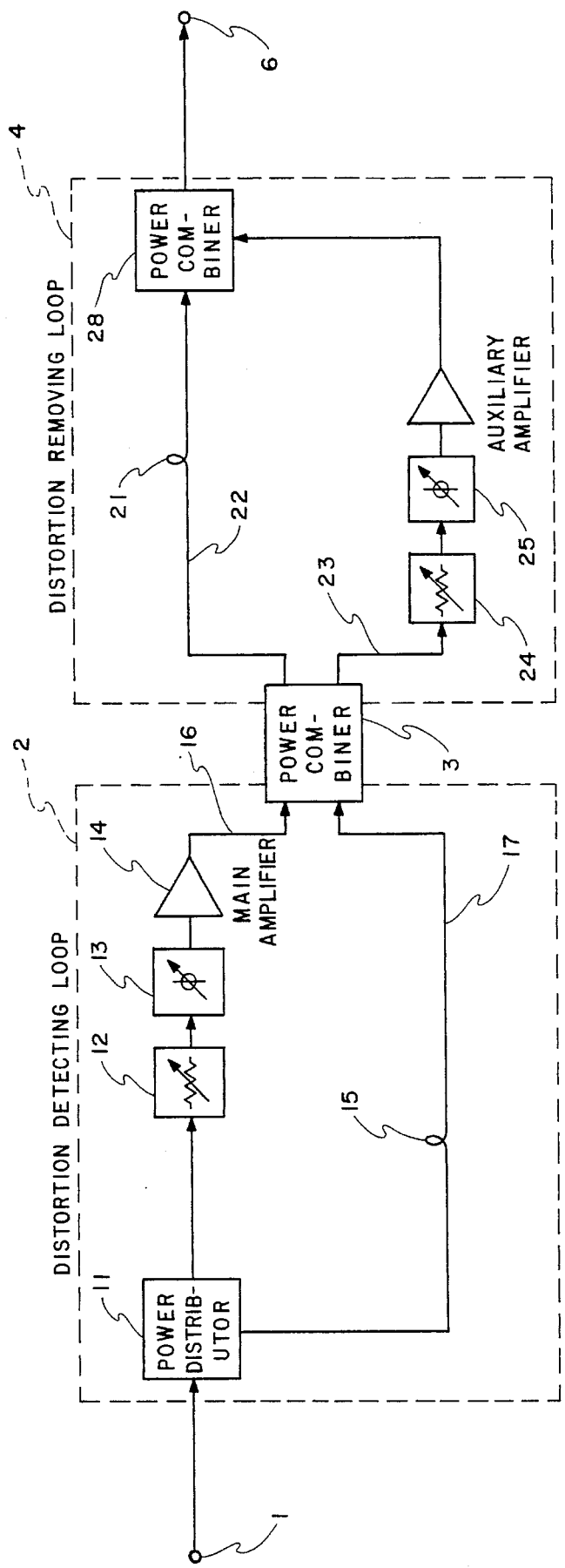
FIG. 8 is a construction of an example of a conventional feedforward amplifier.

The re-control of the distortion detecting loop 7 in the step 412 is performed according to the flowchart shown in FIG. 7. This re-control is similar to the control of the distortion detecting loop 7 in the Second Step described with respect to FIG. 4. After the control circuit 61 connects the high frequency switches 52 and 53 to the terminals B (steps 4121 and 4122), the control circuit 61 controls the amount of attenuation of the variable attenuator 12 and the amount of phase shift of the variable phase shifter 13 such that the level of the pilot signal detected by the sync detection circuit 54 and input to the control circuit 61 becomes a minimum value which is smaller than the predetermined value (steps 4123 to 4128).

Thereafter, turning OFF the high frequency switch 63 confirms that the pilot signal frequency is coincident with neither the input signal frequency nor the distortion frequency caused by the input signal (step 4129). Then, at a time when the control of the distortion detecting loop 7 is completed, the distortion removing control voltages for the variable attenuator 24 and the variable phase shifter 25 and the output voltage of the environment sensor 64 are updated and stored in the memory in the control circuit 61 (step 4130).

It is possible in the step 409 shown in FIG. 6 to compare the output voltage of the environment sensor 64 stored in the Third Step with the current output voltage of the environment sensor 64 to decide whether or not the current voltage is largely changed from the predetermined value. If it is largely changed, the distortion detecting loop 7 is controlled again.

According to this embodiment, it is possible to constitute a feedforward amplifier which can be stably controlled by performing the First to Fourth Steps sequentially, which includes components having frequency characteristics which are not as precise as required in the conventional feedforward amplifier and which are durable for a long period of time due to the reduced number of controls of the distortion detecting loop.

As described hereinbefore, according to the present invention, the pilot signal frequency is never coincident with the frequency of the input signal input to the distortion detecting loop. Therefore, it is possible to stably control the feedforward amplifier. Further, the pilot signal frequency can be set around the frequency of the input signal to be amplified. The frequency characteristics of one of the two